United States Patent [19]
Wolfe et al.

[11] Patent Number: 5,550,082
[45] Date of Patent: Aug. 27, 1996

[54] METHOD AND APPARATUS FOR DOPING SILICON WAFERS USING A SOLID DOPANT SOURCE AND RAPID THERMAL PROCESSING

[75] Inventors: John C. Wolfe; Wanda Zagozdzon-Wosik, both of Houston, Tex.

[73] Assignee: The University of Houston System, Houston, Tex.

[21] Appl. No.: 414,031

[22] Filed: Mar. 30, 1995

Related U.S. Application Data

[63] Continuation of Ser. No. 157,337, Nov. 18, 1993, abandoned.

[51] Int. Cl.⁶ ................................................. H01L 21/223
[52] U.S. Cl. ................................. 437/168; 437/950
[58] Field of Search ................................. 437/168, 950; 148/DIG. 30, DIG. 36, DIG. 37, DIG. 38, DIG. 144, DIG. 157

[56] References Cited

U.S. PATENT DOCUMENTS

| | | | |
|---|---|---|---|
| 4,160,672 | 7/1979 | Rapp | 437/168 |
| 4,381,213 | 4/1983 | Flowers et al. | |
| 4,588,455 | 5/1986 | Genser | 437/168 |
| 4,661,177 | 4/1987 | Powell | 148/189 |
| 4,679,300 | 7/1987 | Chan et al. | 437/25 |
| 4,742,022 | 5/1988 | Oren et al. | |
| 4,749,615 | 6/1988 | Bonny et al. | |
| 4,929,572 | 5/1990 | Saito et al. | 437/160 |

Primary Examiner—George Fourson
Attorney, Agent, or Firm—Jenkens & Gilchrist

[57] ABSTRACT

The present invention is, in part, a new process for dopant diffusion, both p-type (e.g., B) and n-type (e.g., P, As), into silicon wafers, using rapid thermal processing (RTP). It uses a surface layer of a new planar dopant as an active dopant source. Such a source is produced using either a rigid holder wafer with a spin-on dopant or CVD doped oxides deposited on its surface, or such a source is high pressure planar solid source having a surface that has been activated by dry etching or sputtering etching. Such a dopant source is placed in proximity to a processed silicon wafer in such a manner that its active surface is facing the surface of the silicon wafer during RTP. Both the silicon wafer and the dopant source are heated by lamps emitting light causing transport of dopant from the dopant source to the silicon surface. The dopant source may be produced using either silicon wafers, quartz or ceramic plates or planar solid diffusion sources which are commercially available in a form of solid discs containing compounds containing various dopant atoms (e.g., B, P, and As).

14 Claims, 2 Drawing Sheets

METHOD AND APPARATUS FOR DOPING SILICON WAFERS USING A SOLID DOPANT SOURCE AND RAPID THERMAL PROCESSING

This is a continuation of application Ser. No. 08/157,337, filed on Nov. 18, 1993, which was abandoned upon the filing hereof.

FIELD OF THE INVENTION

The present invention relates to methods and apparatus for doping silicon wafers. More particularly, the present invention relates to methods and apparatus for doping a silicon wafer using a novel planar dopant source placed in close proximity to the silicon wafer during rapid thermal processing.

DESCRIPTION OF THE RELATED ART

Doped layers, in silicon technology, have been traditionally produced using ion implantation followed by thermal annealing, and by dopant diffusion from gaseous sources, chemical vapor deposition (CVD) doped oxides, polysilicon sources and so on. In very large scale integration (VLSI) and ultra large scale integration (ULSI) integrated circuits (ICs) the small sizes connected with individual devices impose new requirements for dopant distributions demanding that junctions be very shallow and heavily doped. To ensure shallow junction fabrication, rapid thermal processing (RTP), with its high temperature annealing realized in a very short period of time, has been introduced as a substitute for furnace processing.

In the present silicon technology for VLSI and ULSI devices, doping is based on ion implantation which provides well-controlled dopant concentration but which has to be followed by thermal annealing for postimplantation damage removal and dopant activation. Formation of shallow junctions, especially those doped with light atoms (e.g., B), is difficult due to channeling effects which are avoided by means of substrate preamorphisation. The removal of crystallographic defects, especially those at the amorphous/crystalline (a/c) interface, requires proper thermal processing and is not always successful.

The removal of crystallographic defects, especially end-of-range defects at the amorphous/crystalline (a/c) interface, requires relatively high temperature processing which has to be done however in a very short time in order to obtain small penetration depth of implanted dopants. Since the requirements for shallow junction formation impose limitations on a temperature-time product during annealing steps, the elimination of defects becomes very difficult; as a consequence, defect related excessive leakage currents in the junctions may deteriorate device operation. Also, ion implantation can be the reason for degradation of gate oxide at the edges of source and drain regions in MOSFETs. In addition, if lower temperatures are used for smaller junctions (xj) the resistivity of doped layers increases due to smaller dopant activation (because of lower solid solubility of dopants at these temperatures), thus reducing current drive capability and device performance.

Formation of shallow junctions using ion implantation results in asymmetrical structures due to shadowing effects and it may also be responsible for lateral channeling of implanted ions thereby affecting the device dimensions; thus very complicated implantation scheme is required to alleviate these effects.

Implantation used by many chip producers for shallow junction formation in deep and narrow trench structures is an increasingly difficult fabrication step. Such a step always results in non-uniform dopant distribution along the walls and the bottom of such structures, thereby detrimentally affecting device operation.

Another doping method that overcomes the difficulties related to shallow junction fabrication is rapid thermal diffusion (RTD). RTD is a defect-free process that gives well-controlled dopant concentrations. The main advantage of a diffusion process over ion implantation is that it does not introduce structural damage to single crystals. Further, the process complications related to elimination of channeling effects during ion implantation do not exist in diffusion processes. Diffusion sources such as spin-on dopants described in U.S. Pat. Nos. 4,468,260 and 4,729,962; planar solid dopant sources such as described in U.S. Pat. No. 4,661,177; doped polysilicon; as well as ion implanted silicides along with ion implanted metals, which form silicide with simultaneous dopant diffusion; have all heretofore been reported. All of these sources and methods associated with their use have certain disadvantages and limitations. Spin-on dopants, deposited directly on the silicon surface, produce a planar layer which must be removed (deglazed) after the diffusion process. Such a deglazing step may dramatically decrease the initial oxide thickness in some regions of devices. In addition, a residual, soft, HF-insoluble, and carbon rich film is left after such a RTD. This film may adversely affect operation of electronic devices. Planar solid sources require special thermal preparation which ensures sufficient dopant supply during furnace processes but not necessarily enough supply to obtain reproducible doping during RTD. The short time of RTD does not allow for thermal decomposition of the bulk material of the solid source or for solid diffusion of dopant to the source surface and subsequent transport to the processed wafer followed by diffusion. Thus, dopant evaporation is limited by the surface efficiency and cannot be easily liberated. Doping from doped polysilicon gives very good low resistivity layers but their major applications involve bipolar IC's, not MOS-based circuits. Implantation of dopants into refractory metals or their silicides looks very promising but have foreseeable applications in production of planar junctions only, and more in MOS devices than in bipolar technology, due to basic differences between these structures.

Gas immersion laser doping (GILD) and plasma doping are other methods for low temperature dopant introduction. GILD is based on melting and regrowth of silicon and simultaneous dopant diffusion during laser irradiation, while plasma doping relies on a glow discharge using a dopant containing gas. Both methods are still in research stages, with possible future application in planar junction fabrication rather than in structures such as required in trench technology.

Another important problem related to a quality of high density semiconductor circuits (VLSI and ULSI ICs) is the requirement for low density of defects, beth crystallographic, (i.e., related to crystal damage and presence of impurities) and surface originated (i.e., defects related to particulate contaminations). To increase the reliability and yields of advanced ICs, a fabrication technology must rely on integrated processes, where a sequence of processes is performed in a micro-factory with single wafers undergoing various operations, preferably in a vacuum. RTD may be used as an important step incorporated in a such a technology provided that such a process itself does not introduce any contaminants and is compatible with the device technology. Among all reported diffusion processes, GILD and plasma doping offer the best prospects for single wafer processing applications; however, limitations with respect to doping of non-planar structures exist in these processes.

SUMMARY OF THE INVENTION

The present invention provides a new process of RTD for shallow, heavily doped planar junctions as well as trench junctions in standard (non in-situ) IC technology and in single wafer multiprocessing. A major new feature of the process described herein is use of an active surface of a planar dopant source, built either using a dopant source in a form of doped oxides, spin-on dopant deposited on a holder wafer (instead of direct deposition on the processed silicon wafer), or use of high vapor pressure planar sources which have to be activated by an etch-beck process used for removal of the dopant depleted surface. Thus, the present invention provides a new diffusion source for RTP diffusion which can be placed in proximity to a processed silicon wafer with the active layer facing that silicon wafer. Lamps, used in RTP to provide radiation energy, illuminate both the dopant source and silicon wafer so that dopant may be supplied from the source via vaporization and transported to the silicon surface due to the concentration gradient. Dopant is liberated from the deposited dopant source which means that only the surface layer (a few thousand angstroms thick) is active. This obviates the need for thermal decomposition of a bulk material containing dopants, as is required in cases involving planar solid sources (Note: this is an especially critical step for As and P). A major advantage of the process described herein is its useful application not only in shallow planar junction fabrication but also in doping trench capacitors. The described process involves non-contact diffusion which ensures extreme cleanliness. The described process also offers advantages as it does not require deposition of any layers containing dopant in a chemical suspension. The process described herein is a perfect candidate for single wafer multiprocessing. This technology results in low contamination and particulate levels allowing for high yields in VLSI and ULSI ICs.

Accordingly, it is an object of the present invention to provide a new process of RTD for shallow, heavily doped planar junctions as well as trench capacitors in standard (non-in-situ) IC technology and in single wafer multiprocessing.

BRIEF DESCRIPTION OF THE DRAWINGS

Other objects, advantages and novel features of the present invention will become apparent from the following detailed description of the invention when considered in conjunction with the accompanying drawings wherein.

DETAILED DESCRIPTION OF THE INVENTION

In rapid thermal diffusion (RTD) according to the teachings of the present invention, a dopant source is produced using either a rigid disc holder, which serves as a substrate for deposition of a dopant in a form of a spin-on dopant source, doped oxides, or by using a planar dopant source with high dopant vapor pressure. In the case of spin-on dopant deposition, one of a number of commercially available dopant sources (B, P, As) may be used to spin coat the holder wafer and to become a new planar dopant source. As in the case of furnace diffusion, where spin-on dopant is directly deposited on the silicon wafer, the dopant spun on a holder wafer has to be prebaked at a low temperature, according to the manufacturer's specifications, in order to evaporate all solvents. In the case of doped oxides, any methods used in silicon technology for deposition of such oxides (CVD, LPCVD, PECVD) may be implemented for dopant source fabrication. Doped oxides may be also obtained by ion implantation into undoped, deposited oxides. As mentioned above, a third category of dopant sources is planar dopant sources having high vapor pressure of compounds. This latter characteristic allows efficient evaporation of dopant from the surface region of the source.

Figure 1:
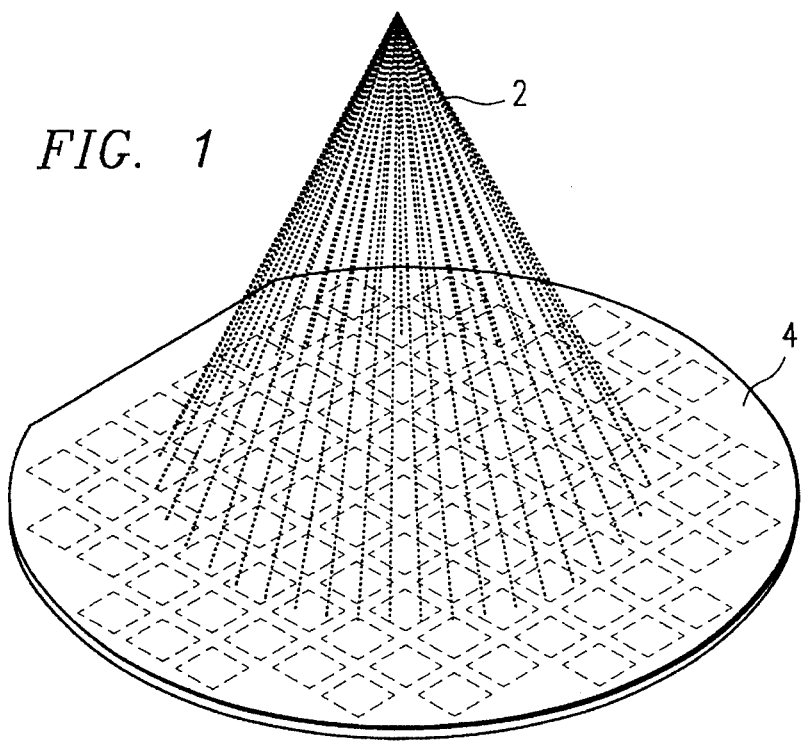
FIG. 1 depicts deposition of a spin-on dopant directly on a silicon wafer.
Figure 2:
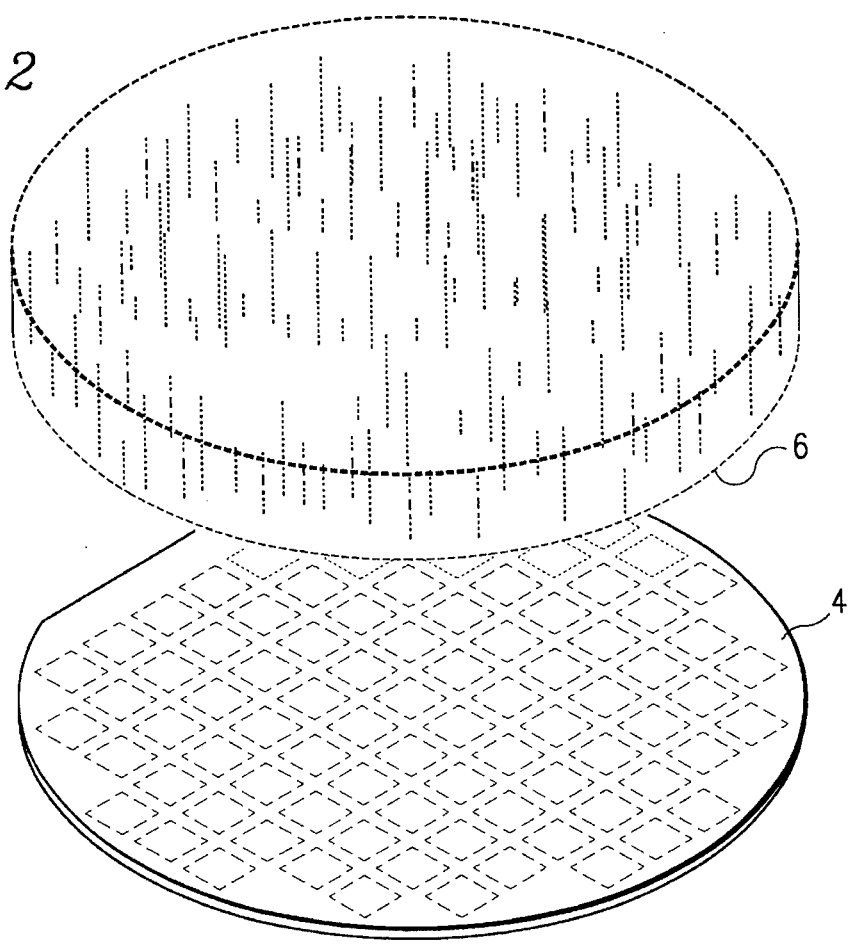
FIG. 2 depicts a spin-on source deposited on a holder wafer positioned over a silicon wafer as taught by the present invention.

Referring now to the FIGS. wherein for clarity and convenience like or similar elements are designated by identical reference numbers throughout the several views and wherein the various elements are not necessarily drawn to scale, and more particularly to FIGS. 1 and 2, there is shown a dopant source according to the present invention in contrast to a prior art method of deposition. FIG. 1 depicts direct deposition of a spin-on dopant 2 onto a silicon wafer 4, a prior art technique. FIG. 2, on the other hand, in conformance with the teachings of the present invention, shows a dopant source 6 comprising a spin-on dopant deposited on a holder wafer, which holder wafer is physically distinct from a silicon wafer 4 to be ultimately doped.

In the practice of the method of the present invention, after the dopant source is obtained, the dopant source and a silicon wafer are positioned in close proximity to each other for further processing. This positioning may be effected by any number of support means, such as quartz bolts, which are conventionally used to support processed wafers on a quartz tray during RTP. When such bolts are used, the degree of mutual proximity is determined by the height of flanges grooved on the bolts. Both wafers are simultaneously heated by lamps and dopant is liberated from the active surface of dopant source and transported to the silicon surface where solid state diffusion into the silicon wafer takes place.

Figure 3:
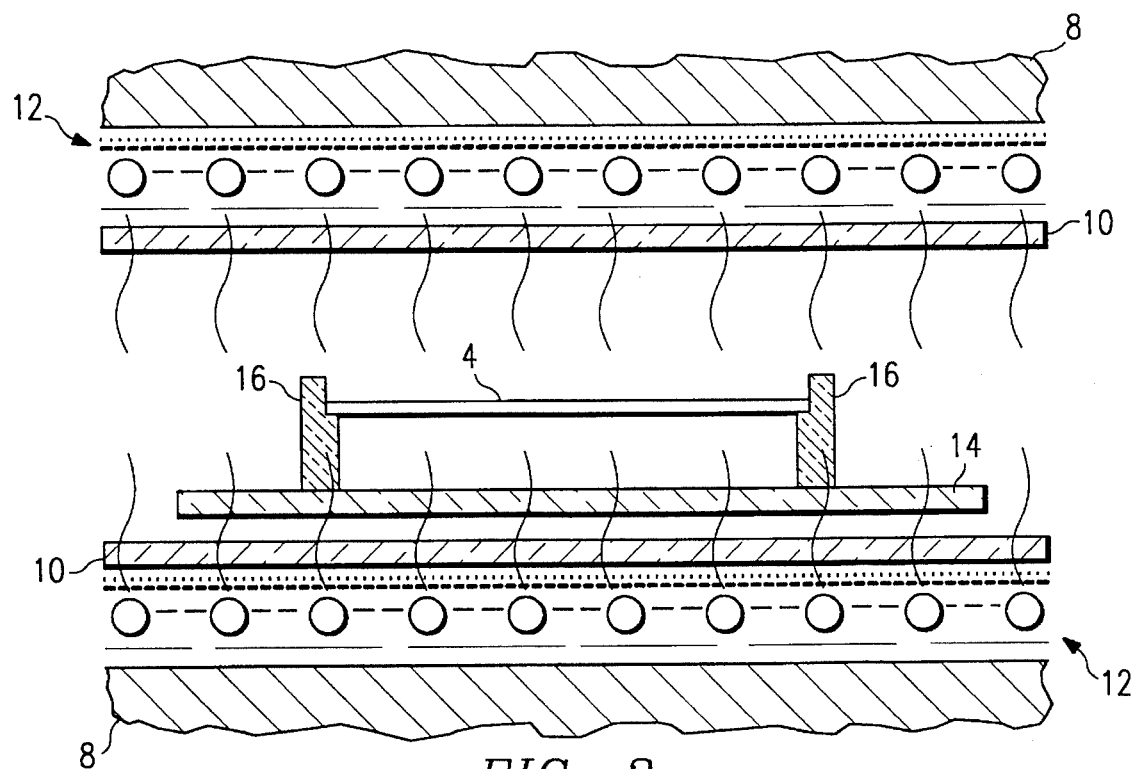
FIG. 3 is a schematic cross-sectional view of an RTP reactor with a silicon wafer placed on quartz bolts.
Figure 4:
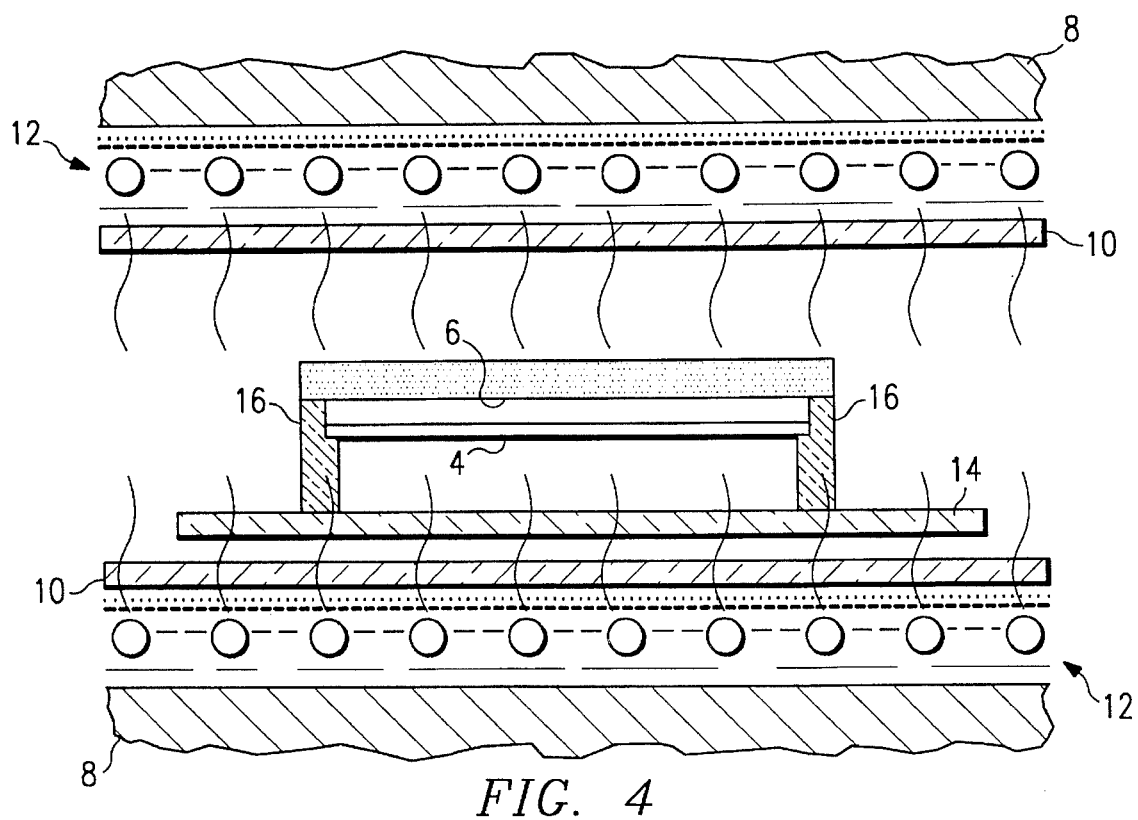
FIG. 4 is a schematic cross-sectional view of RTP diffusion with a novel diffusion source according to the teachings of the present invention.

Referring now to FIGS. 3 and 4, details regarding an embodiment of an apparatus according to the teachings of the present invention may be seen. In both FIGS. 3 and 4 an RTP reactor consisting of a water cooled outer portion 8, a quartz tube 10 positioned within the portion 8, and lamps 12 heating water surrounding tube 10 within portion 8 is shown. A quartz tray 14 is positioned within quartz tube 10 by conventional means. Quartz bolts 16 on tray 14 provide means for supporting a silicon wafer 4 only (such as is shown in FIG. 3) or a diffusion source wafer with spin-on source 6 according to the teachings of the present invention together with a silicon wafer 4 (such as is shown in FIG. 4). Of course, other support mechanisms and environments in which RTP can be effected can be constructed by those skilled in the art and can be suitably employed to practice embodiments of the present invention.

The distance between the dopant source and silicon wafer is an important parameter which determines dopant transport during RTD. With reference to the specific embodiment shown in FIG. 4, due to high durability of quartz belts at high temperature, this distance does not change in time, providing in this way good reproducibility of the diffusion processes.

The working silicon wafer 4 may be located above or below the dopant source 6 depending on the design of a rapid thermal processors. Temperature of the processed silicon wafer is controlled by the lamp intensity activated by e.g., a computer operated system (not shown) and it can be measured by pyrometer (not shown) pointing at its back side, as in typical RTP steps. Gas atmosphere such as $N_2$, $O_2$ or $N_2+O_2$ in the RTP oven can also be maintained by a computer system. Typical temperatures are up to 1150° C. and process times up to 300 seconds, and may be adjusted according to device requirements. Higher diffusion temperatures are not necessary for shallow junction formation and, moreover, slip lines in silicon wafers may be more easily generated during such processes.

In order to obtain reproducible diffusion parameters the process has to include surface activation of dopant source. This may be readily obtained by etching back a thin layer of deposited dopant source, whether in the form of spin-on source or doped oxides, as well as by etching a thin layer of high vapor pressure planar dopant source. In all cases plasma-assisted etching, such as plasma etching, reactive ion etching or sputtering, may be used to remove a layer depleted of dopant and to expose a new, dopant-rich layer. This is an important step in such a rapid thermal diffusion process.

The proposed new RTD process uses a wafer-shaped rigid material, mechanically stable at high temperature, as a holder for deposited dopant or a planar dopant source which also must be thermomechanically durable. Thus, source warpage, which is induced by a temperature gradient along the wafer radius during warm-up, steady state and cool-down periods, can be prevented and constant distance between the dopant source and the silicon wafer can be maintained. Therefore, dopant diffusion from the dopant source to the surface of a processed silicon wafer is uniform as may be monitored by a small variation of sheet resistance (Rs) within the whole wafer. Silicon wafers, planar solid sources commercially available, or other rigid materials such as quartz or ceramics may be used as holder discs or, alternatively, a planar dopant source with high vapor pressure may be used as an off-the-shelf dopant. It should be noted, however, that differences exist between diffusion parameters obtained for various dopants depending on the disc types. In general, solid source discs are less susceptible to temperature stress than silicon wafers, and thus they can be used as a spin-on holders in a large number of diffusion processes. Also quartz or ceramic materials can be used as holders for dopant sources. The number of processes where a single wafer can be reused as a dopant source is smaller for silicon wafers as compared to other holders such as solid source discs, ceramics or quartz. However, one silicon wafer may be used in several processes depending on the temperature conditions of the process. Low temperatures increase the lifetime of such a source, while high temperatures accelerate the source warpage leading to its degradation For this reason the use of types of holders other than silicon wafers is more economical if they are to be used to fabricate integrated circuits on a large scale. Among various planar solid dopant sources, only the sources designed for high temperature processes may be used as durable diffusion source wafers. In the case of low temperature planar solid sources, the wafer warpage induced by stress generated during RTP limits use of a single source to processes having a few steps only. With respect to thermomechanical stability, such sources are comparable to the silicon wafers used as diffusion-source wafers.

In the case of boron, diffusion of dopant into a silicon wafer is independent of the material used as a dopant holder for the spin-on source. The same sheet resistance and junction depth results can be obtained whether a silicon wafer or a planar solid dopant source is used as a holder for active dopant.

Diffusion of phosphorus into silicon is very reproducible provided that a silicon wafer or other non-porous rigid material is used as a holder disk supporting the active dopant layer in the dopant source. A spin-on dopant source may be also deposited on a planar solid source used as a holder wafer, but saturation of the solid source with liquid spin-on dopant is required for high dopant concentration processes in such a case.

With respect to As diffusion, the silicon wafer can not be used as a holder for dopant since there is no effective evaporation of the As source. However, arsenic may be diffused at high dopant concentrations provided that the spin-on dopant is used on the planar solid arsenic source. The roughness of the solid source makes the effective surface of the dopant layer large as compared to planar area of a given disc diameter, which increases the volume concentration of dopant. The possibilities of the influence of oxygen from the planar solid source on As diffusion cannot be excluded either.

All of the foregoing conclusions are based on sheet resistance and junction depth measurements obtained in all dopant diffusions under various thermal conditions.

The proposed new RTP diffusion, whether using silicon wafers, solid-source discs or other rigid dopant holders, allows defect-free introduction of dopants into silicon in a clean (with respect to spin-on sources deposited directly on the surface) and reproducible (with respect to solid sources) way for all dopants.

In contrast to planar solid dopant sources, where the bulk of the source is responsible for dopant diffusion (especially for P and As, less for B where a $B_2O_3$ layer is formed the surface of the BN source) the active dopant source, in the proposed RTD, is limited to the surface region. Thus, the new diffusion sources may be used in various temperature and time conditions without any additional thermal steps, except for standard low temperature prebaking used to evaporate dopant solvents in the case of sources implementing spin-on dopants.

The new diffusion process may be used in production of VLSI silicon integrated circuits, where shallow junctions (less than 0. 1 micron) are required. In addition, this diffusion method may be especially advantageous for the fabrication of trench capacitors, since the dopant source is located in close proximity to silicon wafer but is not directly deposited on the object wafer. Thus, this RTD method may be used both in bipolar and MOS VLSI/ULSI technologies.

The results of sheet resistance and junction depth measurements show that $R_s$ can be as low as a few ohms/sq. and $x_j$ can be less than 0.1 micron. In addition, silicon diodes have been fabricated to test these processes and good, no leaky I–V characteristics have been obtained. More importantly, the uniform doping of trench capacitors has been revealed (both along the walls and at the bottom of deep trenches).

Obviously, numerous modifications and variations are possible in view of the above teachings. Accordingly, within the scope of the appended claims, the present invention may be practiced otherwise than as specifically described above.

What is claimed is:

1. A method of directly doping a silicon wafer comprising the steps of:

producing a planar dopant source comprising a dopant source deposited on a thermochemically stable holding disk;

etching a layer of dopant depleted material from said planar dopant source to expose a dopant rich layer;

disposing the resulting planar dopant source proximate to said silicon wafer; and then thermally processing for a time period less than about 300 seconds said planar dopant source and said silicon wafer so that the dopant diffuses onto said silicon wafer producing a sheet resistance of about three ohms/sq, said holding disc remains substantially planar during said step of thermally processing, and wherein said dopant source comprises a spin-on dopant.

2. A method of diffusing a dopant material comprising the steps of:

providing a planar dopant source comprising a dopant deposited on a thermochemically stable rigid dopant holder;

etching a layer of dopant depleted material from said planar dopant source to expose a dopant rich layer;

placing the resulting dopant source proximate to a silicon wafer in such a manner that the dopant layer faces the silicon wafer;

then rapidly heating the dopant source and the silicon wafer to a temperature above 800° C. for a period of time not more than 300 seconds, said dopant source remains substantially planar during said rapid heating step;

doping said silicon wafer, during said rapid heating step so that the sheet resistance on said silicon wafer is approximately three ohms/sq;

wherein said dopant is selected from the group consisting of boron, phosphorous or arsenic, and wherein said planar dopant source is prepared using a spin-on dopant source, and wherein prebaking of the source is effected.

3. A method as recited in claim 2 wherein said step of providing a planar dopant source comprises the step of activating a previously used dopant source.

4. A method as recited in claim 3, wherein said activation is effected via plasma assisted etching, which etching is used to remove dopant depleted material and to expose dopant rich material.

5. The method of claim 2, wherein said doping of said silicon wafer creates a p-n junction element in the silicon wafer.

6. The method of claim 2, wherein said doping of said silicon wafer creates a trench capacitor element in the silicon wafer.

7. The method of claim 5, further comprising performing additional manufacturing steps on the silicon wafer as part of a single wafer multiprocessing process.

8. The method of claim 6, further comprising performing additional manufacturing steps on the silicon wafer as part of a single wafer multiprocessing process.

9. A method of directly doping a silicon wafer comprising the steps of:

a) providing a source wafer having a source dopant, said source wafer constructed of at least a rigid material which remains substantially planar during a thermal processing step, said source dopant being disposed on a planar surface of said source wafer;

b) etching a layer of dopant depleted material from said source dopant to expose a dopant rich layer;

c) placing a silicon wafer in a thermal apparatus;

d) disposing the resulting source wafer in said thermal apparatus such that said source wafer is in a parallel, spaced relationship to said silicon wafer and, said dopant layer is facing said silicon wafer;

e) then thermally processing said source wafer and said silicon wafer for up to 300 seconds at a temperature of up to 1150 degrees C. so that said silicon wafer is doped to have a sheet resistance of less than approximately three ohms/sq.

10. The method of claim 9, wherein said source dopant is a spin-on source dopant.

11. The method of claim 9, wherein said parallel, spaced relationship between said source dopant and said silicon wafer is less than 1 mm.

12. The method of claim 9, wherein said parallel spaced relationship between said source dopant and said silicon wafer is approximately 0.6 mm.

13. A method of doping a silicon wafer comprising the steps of:

etching a layer of dopant depleted material from a planar dopant source to expose a dopant rich layer;

placing the resulting dopant source in a parallel, spaced relationship with a silicon disk, said spaced relationship being less than one millimeter;

then thermally processing said dopant source and said silicon disk for up to 300 seconds, said planar dopant source remaining substantially planar during said thermal processing step;

diffusing said dopant across said space between said dopant rich layer and said silicon disk during said thermal processing step thereby creating a doped surface on said silicon disk in locations having a sheet resistance of approximately 3 ohms/sq.

14. A method of diffusing a dopant material comprising the steps of:

preparing a planar dopant source, by activating effected via plasma assisted etching, said etching is used to remove dopant depleted material and to expose dopant rich material, wherein a previously used dopant source is employed, comprising a dopant deposited on a thermochemically stable rigid dopant holder;

etching a layer of dopant depleted material from said planar dopant source to expose a dopant rich layer;

placing the resulting dopant source proximate to a silicon wafer in such a manner that the dopant layer faces the silicon wafer;

then rapidly heating the dopant source and the silicon wafer to a temperature above 800° C. for a period of time not more than 300 seconds, said dopant source remains substantially planar during said rapid heating step;

doping said silicon wafer, during said rapid heating step so that the sheet resistance on said silicon wafer is approximately three ohms/sq;

wherein said dopant is selected from the group consisting of boron, phosphorous or arsenic, and wherein said planar dopant source is prepared using a spin-on dopant source, and wherein prebaking of the source is effected.

* * * * *